(12) United States Patent
Cheng et al.

(10) Patent No.: US 11,349,328 B2
(45) Date of Patent: May 31, 2022

(54) CHARGING DETECTION CIRCUIT, CHARGING CASE, COMMUNICATION APPARATUS OF EARPHONE AND EARPHONE

(71) Applicant: SHENZHEN WEITONGBO TECHNOLOGY CO., LTD., Shenzhen (CN)

(72) Inventors: Shuqing Cheng, Shenzhen (CN); Bincheng Que, Shenzhen (CN); Ming Yang, Shenzhen (CN)

(73) Assignee: SHENZHEN WEITONGBO TECHNOLOGY CO., LTD., Shenzhen (CN)

( * ) Notice: Subject to any disclaimer, the term of this patent is extended or adjusted under 35 U.S.C. 154(b) by 256 days.

(21) Appl. No.: 16/524,010

(22) Filed: Jul. 27, 2019

(65) Prior Publication Data
US 2019/0348852 A1 Nov. 14, 2019

Related U.S. Application Data

(63) Continuation of application No. PCT/CN2018/075657, filed on Feb. 7, 2018.

(51) Int. Cl.
*H02J 7/00* (2006.01)
*G01R 31/3832* (2019.01)
(Continued)

(52) U.S. Cl.
CPC ........ *H02J 7/0086* (2013.01); *G01R 31/3832* (2019.01); *H02J 7/00* (2013.01);
(Continued)

(58) Field of Classification Search
None
See application file for complete search history.

(56) References Cited

U.S. PATENT DOCUMENTS 5,998,971 A 12/1999 Corbridge
9,391,468 B2 * 7/2016 Takada .................. B60L 53/122
(Continued)

FOREIGN PATENT DOCUMENTS

CN 104584369 A 4/2015
CN 204362265 U 5/2015
(Continued)

*Primary Examiner* — Arun C Williams
(74) *Attorney, Agent, or Firm* — Scully Scott Murphy & Presser

(57) ABSTRACT

Provided is a charging detection circuit, a charging case and a communication apparatus of charging. The charging detection circuit includes: a first touch point, a second touch point, a switching circuit, a charging circuit, a detecting circuit and a first communication circuit, where the switching circuit is connected to the first touch point; the charging circuit is connected to the detecting circuit via the second touch point; the first communication circuit is connected to the first touch point and/or the second touch point; when a supply voltage of the first touch point is a system voltage, and the first touch point and the second touch point are both in contact with a first device, the detecting circuit triggers the first communication circuit to acquire a state of charge of the first device.

20 Claims, 7 Drawing Sheets

(51) Int. Cl.
*H02J 7/02* (2016.01)
*H04B 5/00* (2006.01)

(52) U.S. Cl.
CPC ............ *H02J 7/0031* (2013.01); *H02J 7/025* (2013.01); *H04B 5/0006* (2013.01)

(56) References Cited

U.S. PATENT DOCUMENTS

| | | |
|---|---|---|
| 9,627,901 B2 | 4/2017 | Zhai et al. |
| 2009/0039833 A1 | 2/2009 | Kitagawa |
| 2011/0051820 A1 | 3/2011 | Fornage |
| 2012/0099661 A1 | 4/2012 | Fornage |
| 2012/0286724 A1* | 11/2012 | Tsai ........................ H02J 50/12 320/108 |
| 2013/0215983 A1 | 8/2013 | Fornage |
| 2014/0151079 A1* | 6/2014 | Furui ........................ B25F 3/00 173/46 |
| 2016/0294202 A1 | 10/2016 | Zhai et al. |
| 2017/0040816 A1 | 2/2017 | Han et al. |

FOREIGN PATENT DOCUMENTS

| | | |
|---|---|---|
| CN | 204652014 U | 9/2015 |
| CN | 205863988 U | 1/2017 |
| CN | 106921192 A | 7/2017 |
| CN | 206876840 U | 1/2018 |
| EP | 1892791 A1 | 2/2008 |

* cited by examiner

CHARGING DETECTION CIRCUIT, CHARGING CASE, COMMUNICATION APPARATUS OF EARPHONE AND EARPHONE

CROSS-REFERENCE TO RELATED APPLICATIONS

The present application is a continuation of international application No. PCT/CN2018/075657, filed on Feb. 7, 2018, which is hereby incorporated by reference in its entirety.

TECHNICAL FIELD

Embodiments of the present application relate to the technical field of electronics, and more particularly, to a charging detection circuit, a charging case, a communication apparatus of an earphone and an earphone.

BACKGROUND

Currently, most of charging cases and wireless earphones are charged by way of contact of two power touch points. A no-load detection circuit in the charging case is configured to detect whether an output of the charging case is suspended. A charging current detection circuit in the charging case detects the magnitude of a charging current of the charging case when the output of the charging case is connected to a device to be charged.

However, a resistor is generally required to be connected in series between the no-load detection circuit and the charging current detection circuit, for example, a sampling resistor 110 as shown in FIG. 1. In the prior art, it can be found that the charging current is calculated by converting a current into a voltage by the sampling resistor 110, which causes a fixed loss in the resistor and reduction in charging efficiency; moreover, since the sampling resistor 110 converts the current into the voltage, when charging enters into a constant voltage mode, the charging current is getting smaller and smaller, the voltage converted by the resistor is getting weaker and weaker, and has a smaller dynamic range, which makes it difficult for a processor to distinguish such a signal.

SUMMARY

Provided is a charging detection circuit, a charging case, a communication apparatus of an earphone and an earphone. By building a first communication circuit in the charging detection circuit, the charging detection circuit is allowed to perform information interaction between the first communication circuit and a first device to be charged directly, thereby accurately grasping a state of charge of the first device. In addition, since the first communication circuit can perform information interaction with the first device without changing the number of touch points, a change in user habits is further avoided and user experience is improved.

In a first aspect, provided is a charging detection circuit, where the charging detection circuit includes:

a first touch point, a second touch point, a switching circuit, a charging circuit, a detecting circuit and a first communication circuit, where the switching circuit is connected to the first touch point, and the switching circuit is configured to switch a supply voltage of the first touch point between a system voltage and a charging voltage according to a control signal;

the charging circuit is connected to the detecting circuit via the second touch point;

the first communication circuit is connected to the first touch point and/or the second touch point;

when the supply voltage of the first touch point is the system voltage, and the first touch point and the second touch point are both in contact with a first device, the detecting circuit triggers the first communication circuit to acquire a state of charge of the first device via the first touch point and/or the second touch point; and when the state of charge is in an under-voltage state, the control signal controls the switching circuit to connect the first touch point to the charging voltage such that the charging circuit charges the first device.

Compared with the traditional technical solution (as shown in FIG. 1), an embodiment of the present application avoids use of the sampling resistor 110 for charging, but design a first communication circuit in the charging detection circuit, such that the charging detection circuit performs information interaction between the first communication circuit and a first device to be charged directly, thereby accurately grasping a state of charge of the first device.

In addition, since the first communication circuit can perform information interaction with the first device without changing the number of touch points, a change in user habits is further avoided and user experience is improved.

Furthermore, in the embodiment of the present application, when the state of charge is in an under-voltage state, the control signal controls the switching circuit such that the supply voltage of the first touch point is the charging voltage, thereby charging the first device. Further, when the state of charge is in a full-charge state, the control signal controls the switching circuit such that the supply voltage of the first touch point is the system voltage, and controls the charging circuit to be an open circuit. In other words, if the first device does not need to be charged (for example, when the first device is in operation), the detecting circuit performs detection according to the supply voltage of a system (i.e., the system voltage), thereby effectively reducing power consumption of the charging detection circuit. In addition, the charging voltage provided by the switching circuit could effectively improve charging efficiency of the first device.

In a second aspect, provided is a charging case, including the charging detection circuit described in the above first aspect and any of possible implementation manners of the first aspect.

In a third aspect, provided is a first device that can be used in conjunction with the charging case described in the preceding second aspect and any of possible implementation manners of the second aspect.

In a fourth aspect, provided is a charging system, including the charging case described in the preceding second aspect and any of possible implementation manners of the second aspect, and the first device that can be used in conjunction with the charging case provided in the preceding third aspect.

In a fifth aspect, provided is a communication apparatus of an earphone, including:

a third touch point, a fourth touch point and a second communication circuit, where the second communication circuit is connected to the third touch point and/or the fourth touch point; and when the third touch point and the fourth touch point are both in contact with a charging detection circuit, and the second communication circuit receives an uplink modulation signal transmitted by the charging detection circuit via the third touch point or the fourth touch point, the second communication circuit transmits a downlink modulation signal to the charging detection circuit via the third touch point or the fourth touch point, where an uplink signal generated after demodulating the uplink modulation signal is used to request the earphone to transmit the downlink modulation signal to the charging detection circuit, and the downlink modulation signal includes information about a state of charge of the earphone.

In a sixth aspect, provided is an earphone, including the communication apparatus of the earphone described in the preceding fifth aspect and any of possible implementation manners of the fifth aspect.

In a seventh aspect, provided is a charging system, including the charging detection circuit described in the first aspect or the charging case described in the second aspect; and the communication apparatus of the earphone described in the fifth aspect or the earphone described in the sixth aspect.

DESCRIPTION OF EMBODIMENTS

Technical solutions in embodiments of the present application will be described hereinafter in conjunction with the accompanying drawings.

A charging detection circuit is provided in an embodiment of the present application. It should be understood that the charging detection circuit of the embodiment of the present application can be applied to any type of charging device, for example, a charging case, a mobile power source, and the like. The charging detection circuit of the embodiment of the present application may also be applied to any first device that needs to be charged, for example, the first device used in conjunction with the above charging device, for another example, an intelligent wearable device such as an earphone or a wristband, and for another example, a mobile phone, a tablet, a laptop, a computer, MP3 and MP4. For ease of understanding, the embodiment of the present disclosure is described by the example of a charging device being a charging case and the first device being an earphone.

Figure 2:
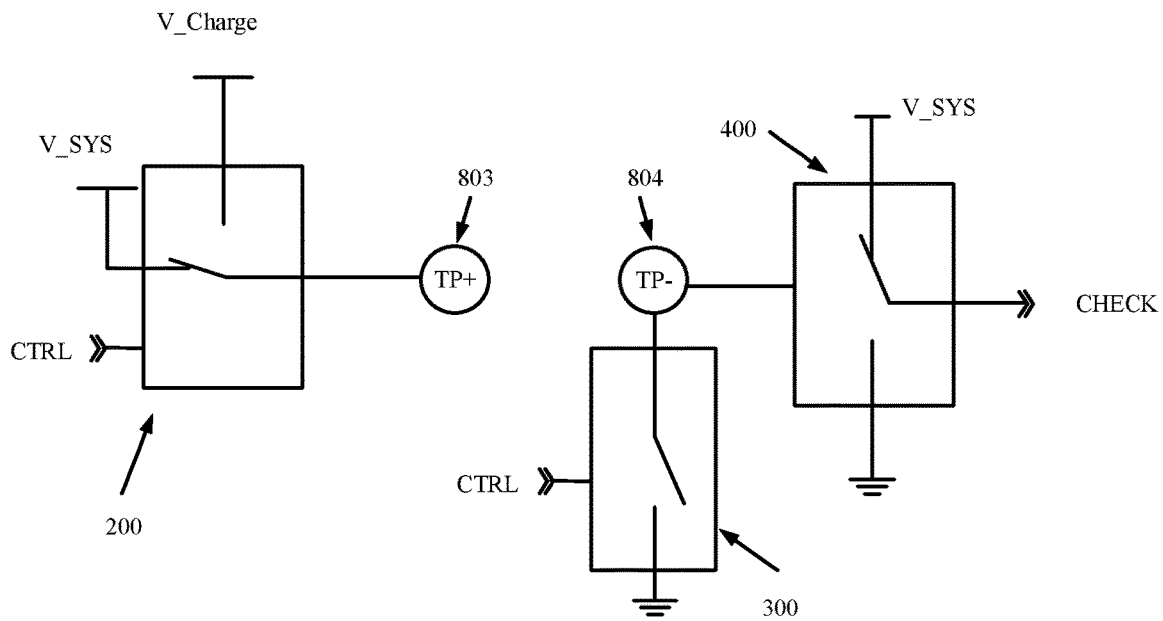
FIG. 2 is a schematic diagram of connection relationships between a first touch point, a second touch point, a switching circuit, a charging circuit and a detecting circuit according to an embodiment of the present application.

Specifically, as shown in FIG. 2, the charging detection circuit includes a first touch point 803, a second touch point 804, a switching circuit 200, a charging circuit 300, a detecting circuit 400 and a first communication circuit 500.

The switching circuit 200 is connected to the first touch point 803, and the switching circuit 200 is configured to switch a supply voltage of the first touch point 803 between a system voltage (V_SYS) and a charging voltage (V_Charge) according to a control signal. The charging circuit 300 is connected to the detecting circuit 400 via the second touch point 804. The first communication circuit 500 is connected to the first touch point 803 and/or the second touch point 804. When the supply voltage of the first touch point 803 is the system voltage, and the first touch point 803 and the second touch point 804 are both in contact with a first device, the detecting circuit 400 triggers the first communication circuit 500 through a detection signal (CHECK) to acquire a state of charge of the first device via the first touch point 803 and/or the second touch point 804. Further, the control signal (CTRL) controls operating states of the switching circuit 200 and the charging circuit 300 according to the state of charge of the first device.

Specifically, when the state of charge is in an under-voltage state, the control signal controls the switching circuit 200 to switch the supply voltage of the first touch point 803 from the system voltage to the charging voltage, and controls the charging circuit 300 to charge the first device. Further, when the state of charge is in a full-charge state, the control signal controls the switching circuit 200 to switch the supply voltage of the first touch point 803 from the charging voltage to the system voltage, and controls the charging circuit 300 to be an open circuit.

Figure 1:
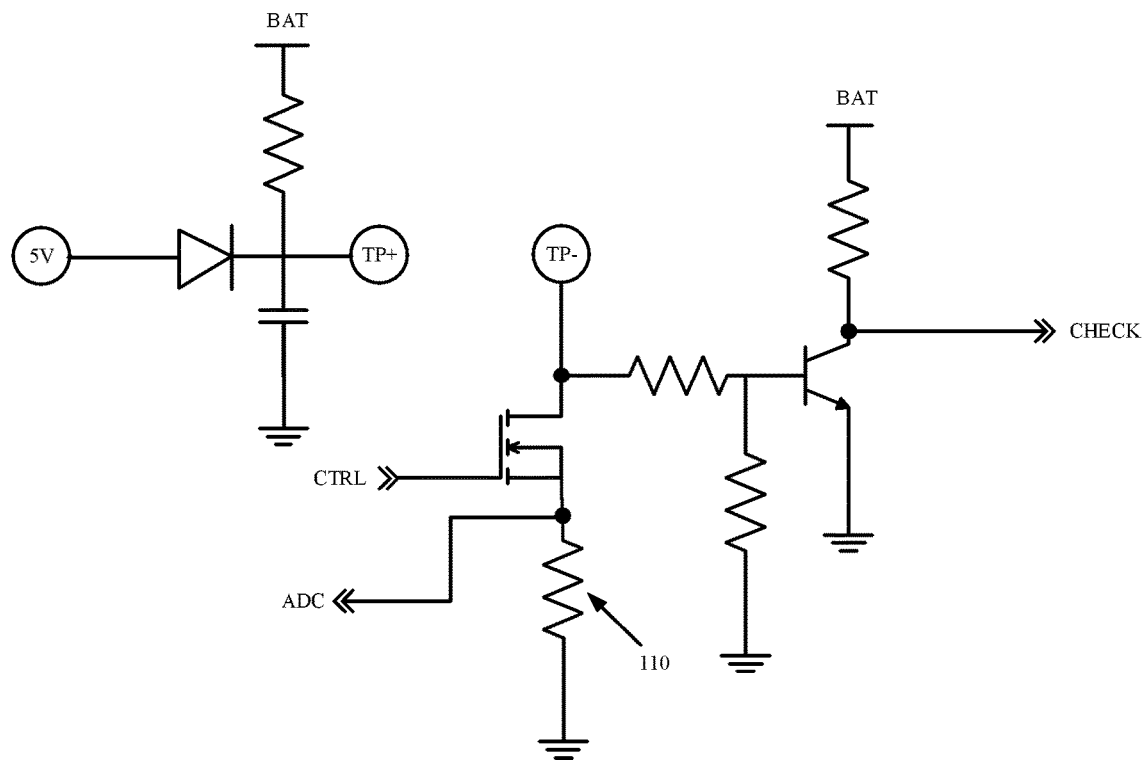
FIG. 1 is a schematic diagram of a prior current calculation circuit.

Compared with the traditional technical solution (as shown in FIG. 1), the embodiment of the present application avoids use of the sampling resistor 110 for charging, but designs a first communication circuit 500 in the charging detection circuit, such that the charging detection circuit performs information interaction between the first communication circuit 500 and a first device to be charged directly, thereby accurately grasping a state of charge of the first device.

In addition, since the first communication circuit 500 can perform information interaction with the first device without changing the number of touch points, a change in user habits is further avoided and user experience is improved.

Furthermore, in the embodiments of the present application, when the state of charge is in an under-voltage state, the control signal controls the switching circuit 200 such that the supply voltage of the first touch point 803 is the charging voltage, thereby charging the first device. Further, when the state of charge is in a full-charge state, the control signal controls the switching circuit 200 such that the supply voltage of the first touch point 803 is the system voltage, and controls the charging circuit 300 to be an open circuit. In other words, if the first device does not need to be charged (for example, when the first device is in operation), the detecting circuit 400 performs detection according to the supply voltage of a system (i.e., the system voltage), thereby effectively reducing power consumption of the charging detection circuit. In addition, the charging voltage provided by the switching circuit 200 could effectively improve charging efficiency of the first device.

Optionally, in an embodiment, the charging detection circuit may further include a first inductor 801 and a first capacitor 802.

Figure 3:
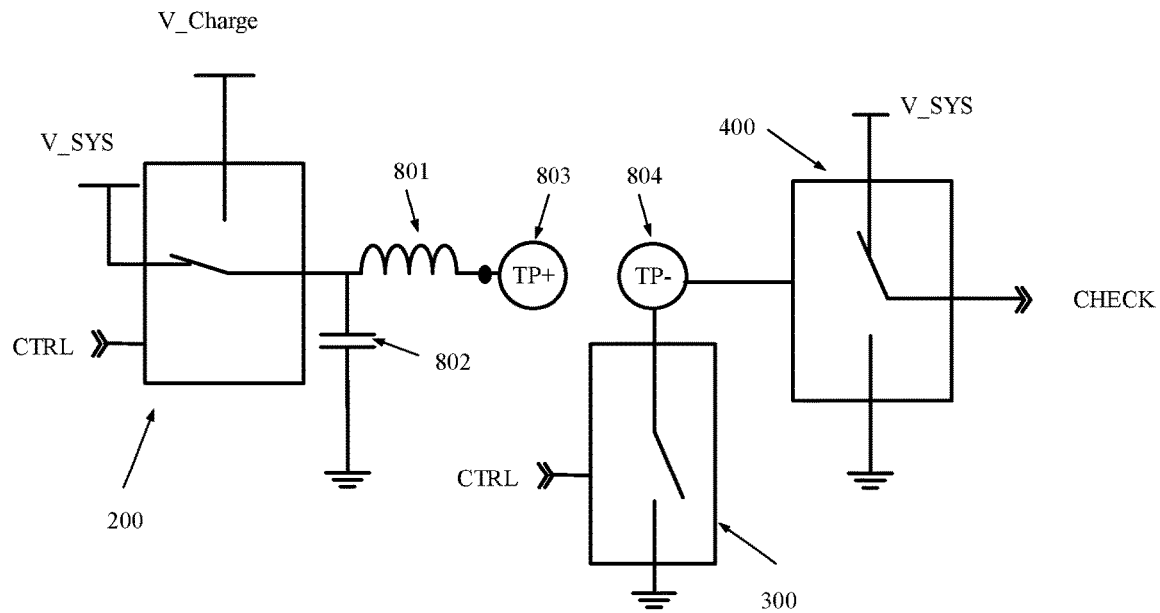
FIG. 3 is another schematic diagram of connection relationships between a first touch point, a second touch point, a switching circuit, a charging circuit, and a detecting circuit according to an embodiment of the present application.

Specifically, as shown in FIG. 3, one end of the first inductor 801 is connected to the switching circuit 200 and connected to the ground via the first capacitor 802, and the other end of the first inductor 801 is connected to the first touch point 803.

More specifically, the first capacitor 802 (filter capacitor) may be used to reduce an alternating current (AC) pulse ripple factor, thereby improving efficiency and smoothness of direct current (DC) output. However, in order to prevent an uplink modulation signal from being filtered by the first capacitor 802 (filter capacitor) on a power supply, an inductive element, i.e., the first inductor 801, may be used between the first capacitor 802 and the first touch point 803 for choking in the embodiment of the present application.

Figure 4:
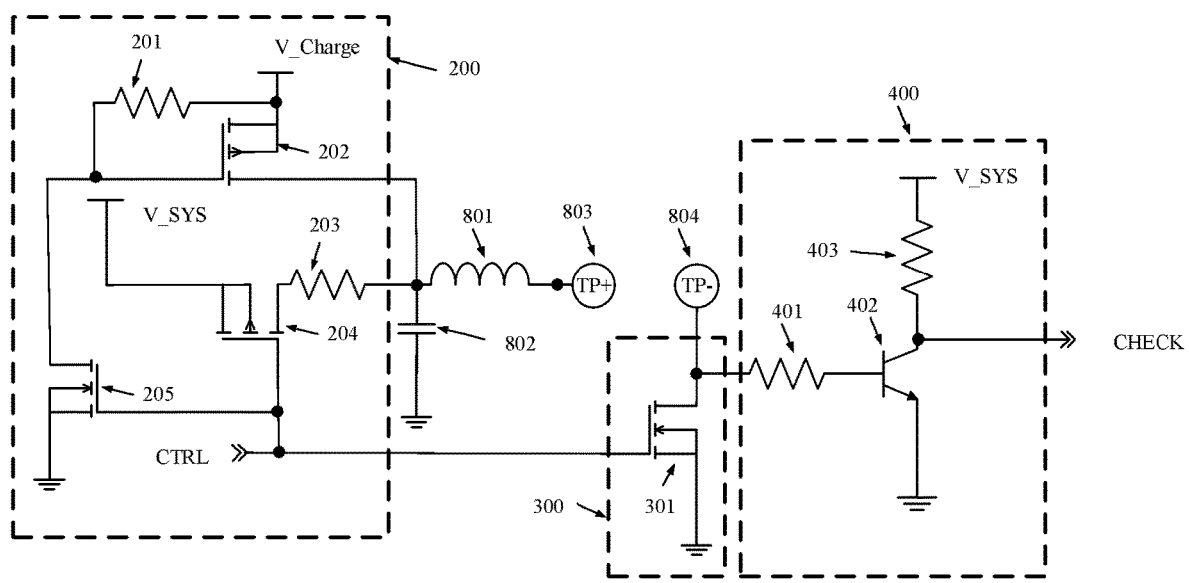
FIG. 4 is a schematic diagram of a switching circuit, a charging circuit and a detecting circuit according to an embodiment of the present application.
Figure 5:
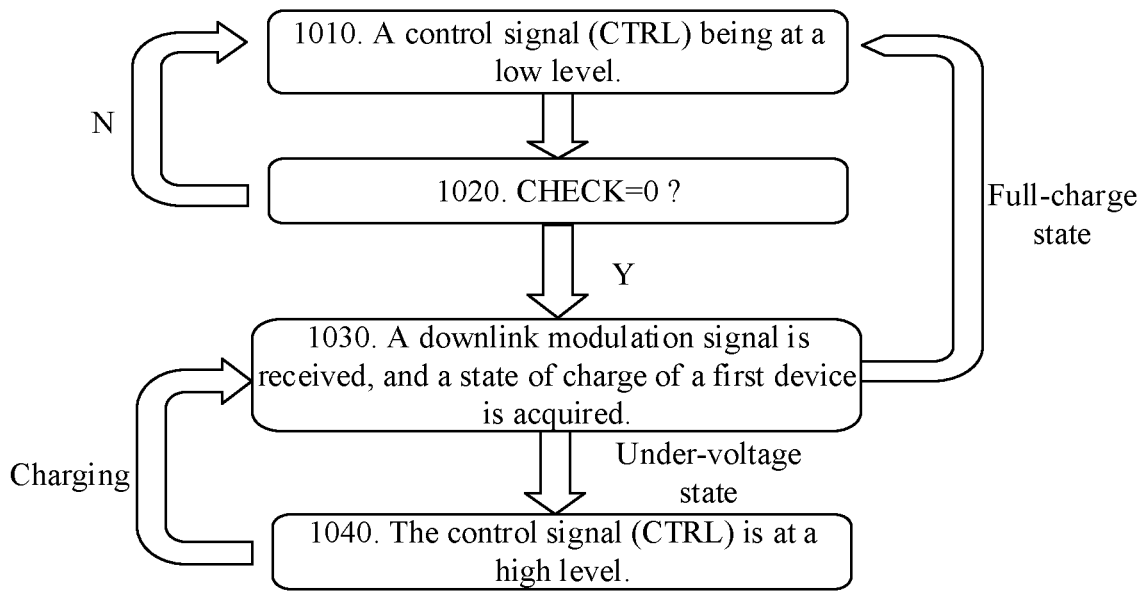
FIG. 5 is a schematic diagram of an operating process of a charging detection circuit according to an embodiment of the present application.

FIG. 4 is a schematic diagram of a switching circuit 200, a charging circuit 300 and a detecting circuit 400 according to an embodiment of the present application. FIG. 5 is a schematic diagram of an operating process of a charging detection circuit according to an embodiment of the present application. To facilitate understanding of the solution, circuit structures and operating principles of the switching circuit 200, the charging circuit 300 and the detecting circuit 400 in the charging detection circuit of the embodiment of the present application are exemplified in the following with reference to FIG. 4 and FIG. 5.

By way of example but not limitation, as shown in FIG. 4, the switching circuit 200 may include a second MOS transistor 202, a third MOS transistor 204 and a fourth MOS transistor 205.

The second MOS transistor 202 receives the charging voltage and is connected to the first touch point 803, and the second MOS transistor 202 is connected to the ground via the fourth MOS transistor 205. The third MOS transistor receives the system voltage and is connected to the first touch point 803. The control signal controls the third MOS transistor 204 to be turned on or off, and controls the second MOS transistor 202 to be turned off or on by controlling the fourth MOS transistor 205 so as to make the supply voltage of the first touch point 803 switch between the system voltage and the charging voltage.

More specifically, as shown in FIG. 4, the switching circuit 200 may further include a first resistor 201 and a second resistor 203.

A source of the second MOS transistor 202 receives the charging voltage, the source of the second MOS transistor 202 is connected to a gate of the second MOS transistor 202 via the first resistor 201, the gate of the second MOS transistor 202 is connected to the ground via the fourth MOS transistor 205, a drain of the second MOS transistor 202 is connected to the first touch point 803, and a gate of the fourth MOS transistor 205 receives the control signal. A source of the third MOS transistor 204 receives the system voltage, a drain of the third MOS transistor 204 is connected to the first touch point 803 via the second resistor 203, and a gate of the third MOS transistor 204 receives the control signal.

It can be found that in the embodiment of the present application, the control signal could control the second MOS transistor 202 to be turned off or on by controlling the fourth MOS transistor 205 so as to make the supply voltage of the first touch point 803 switch between the system voltage and the charging voltage.

By way of example but not limitation, as shown in FIG. 4, the charging circuit 300 may include a fifth MOS transistor 301.

The second touch point 804 is connected to the ground via the fifth MOS transistor 301, and a gate of the fifth MOS transistor 301 receives the control signal. Specifically, the control signal controls the switching circuit 200 to switch the voltage of the first touch point 803 to be the charging voltage, and the control signal controls the charging detection circuit to charge the first device when the fifth MOS transistor 301 is turned on.

By way of example but not limitation, as shown in FIG. 4, the detecting circuit 400 may include a third resistor 401, a triode transistor 402 and a fourth resistor 403.

The second touch point 804 is connected to a base of the triode transistor 402 via the third resistor 401. One end of the fourth resistor 403 receives the system voltage, and the other end of the fourth resistor 403 is connected to the ground via the triode transistor 402. When the supply voltage of the first touch point 803 is the system voltage, and the first touch point 803 and the second touch point 804 are both in contact with the first device, the triode transistor 402 is turned on and triggers the first communication circuit 500 to acquire a state of charge of the first device via the first touch point 803 and/or the second touch point 804.

FIG. 5 is a schematic flow diagram of an operating process of a charging detection circuit according to an embodiment of the present application.

The operating process of the charging detection circuit according to the embodiment of the present application is described in detail below in combination with the flow as shown in FIG.

An implementation circuit in FIG. 4 is used as an example, and the specific operating process of the charging detection circuit is shown in FIG. 5.

1010. A control signal (CTRL) is at a low level (for example, the level is 0).

Specifically, the control signal (CTRL) involved in the embodiment of the present application is at a low level by default. At this time, the third MOS transistor 204 is turned on, while the fifth MOS transistor 301, the fourth MOS transistor 205 and the second MOS transistor 202 are turned off.

1020. Whether a detection signal (CHECK) is 0?

Specifically, when the control signal (CTRL) is at a low level by default, the triode transistor 402 is turned off as well, and further, a voltage of a collector of the triode transistor 402 is a system voltage.

If the first touch point 803 (charging touch point TP+) and the second touch point 804 (charging touch point TP−) are both loaded (that is, the first touch point 803 and the second touch point 804 are both in contact with the first device in this paper), it will result in that the triode transistor 402 is turned on, and further, triggers the first communication circuit 500 to acquire a state of charge of the first device via the first touch point 803 and/or the second touch point 804.

More specifically, the triode transistor 402 is turned on, which further result in that the voltage of the collector of the triode transistor 402 is reduced, that is, the detection signal (CHECK) as shown in FIG. 4 is pulled down, thereby triggering the first communication circuit 500 to acquire a state of charge of the first device via the first touch point 803 and/or the second touch point 804.

1030. A downlink modulation signal is received, and a state of charge of a first device is acquired.

Specifically, when the detection signal (CHECK) triggers the first communication circuit 500 to acquire a state of charge of the first device, the first communication circuit 500 transmits an uplink modulation signal to the first device. If the first communication circuit 500 can receive the downlink modulation signal transmitted by the first device after transmitting the uplink modulation signal, it indicates that the load is valid. Thereby, a system could further adjust the control signal (CTRL) according to information about the state of charge of the first device in the downlink modulation signal.

For example, in the embodiment of the present application, the system may adjust the control signal (CTRL) according to the state of charge of the first device in the following manner:

1040. The control signal (CTRL) is at a high level (for example, the level is 1).

Specifically, when the state of charge is in a full-charge state, the control signal (CTRL) is continued to be maintained at a low level.

However, when the state of charge is in an under-voltage state, the level of the control signal (CTRL) is changed from a low level to a high level. Thereby, the third MOS transistor 204 and the triode transistor 402 are turned off, while the fifth MOS transistor 301, the fourth MOS transistor 205 and the second MOS transistor 202 are turned on.

In addition, in the embodiment of the present application, the first device may be configured to transmit a downlink modulation signal to the first communication circuit again when the first device is fully charged, such that the system changes the level of the control signal (CTRL) from a high level to a low level according to the information about the state of the power in the downlink modulation signal.

The circuit design manner of the first communication circuit 500 of the embodiment of the present application is described below in details.

Figure 6:
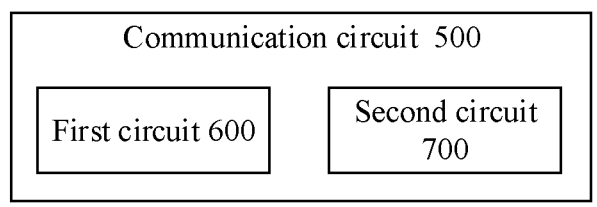
FIG. 6 is a schematic block diagram of a first communication circuit according to an embodiment of the present application.

Optionally, as shown in FIG. 6, the first communication circuit 500 may include a first circuit 600 and a second circuit 700.

Specifically, when the detecting circuit 400 triggers the first communication circuit 500 to acquire a state of charge of the first device, the first circuit 600 generates an uplink modulation signal according to an uplink signal and a carrier signal received, and transmits the uplink modulation signal to the first device via the first touch point 803 or the second touch point 804, and then the second circuit 700 receives a downlink modulation signal transmitted by the first device via the first touch point 803 or the second touch point 804. The uplink signal is used to request the first device to transmit the downlink modulation signal to the second circuit 700, and the downlink modulation signal includes information about the state of charge of the first device.

It should be understood that the embodiment of the present application does not specifically limit the manner in which the first circuit 600 and the second circuit 700 are respectively connected to the first touch point 803 and the second touch point 804.

For example, in an embodiment, the first circuit 600 and the second circuit 700 may both be connected to the first touch point 803. In other words, when the detecting circuit 400 triggers the first communication circuit 500 to acquire the state of charge of the first device, the first circuit 600 transmits the uplink modulation signal via the first touch point 803, and the second circuit 700 receives a downlink modulation signal via the first touch point 803.

For another example, in another embodiment, the first circuit 600 may be connected to the first touch point 803, and the second circuit 700 may be connected to the second touch point 804. In other words, when the detecting circuit 400 triggers the first communication circuit 500 to acquire the state of charge of the first device, the first circuit 600 transmits the uplink modulation signal via the first touch point 803, and the second circuit 700 receives the downlink modulation signal via the second touch point 804.

The specific structure of the first circuit will be exemplarily described below with reference to accompanying drawings.

Optionally, the first circuit 600 includes a first mixer 510, a first low pass filter 520, and a second capacitor 530.

The first mixer 510 is connected to the second capacitor 530 via the first low pass filter 520.

Specifically, when the detecting circuit 400 triggers the first communication circuit 500 to acquire the state of charge of the first device, the first mixer 510 receives the uplink signal and the carrier signal, and generates the uplink modulation signal according to the uplink signal and the carrier signal, and the uplink modulation signal is transmitted to the first device via the first low pass filter 520 and the second capacitor 530 sequentially.

Figure 7:
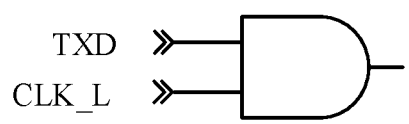
FIG. 7 is a schematic diagram of a mixer according to an embodiment of the present application.

In an embodiment of the present application, the first mixer 510 may modulate an uplink signal of a system to the frequency of a carrier signal (CLK_L) to implement mixing of a serial low-speed signal and a high-speed clock carrier signal, such that a simple amplitude shift keying modulation mode could be realized, and information bits are transmitted through an amplitude of a carrier. It should be understood that the modulation mode of the uplink signal in the embodiment of the present application is not limited to the amplitude shift keying modulation mode. It should also be understood that the uplink signal may be transmit data (Transmit Data, TXD) on a transmit data port of the system. As shown in FIG. 7, the first mixer 510 may be implemented by a simple logic gate AND. However, the embodiment of the present application is not limited thereto. For example, the first low pass filter 520 may also be constructed by a simple split transistor.

Figure 8:
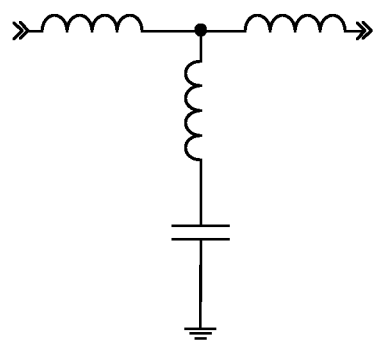
FIG. 8 is a schematic structural diagram of a low pass filter according to an embodiment of the present application.

In addition, the first low pass filter (Low Pass Filter, LPF) 520 in the embodiment of the present application may allow a signal whose frequency is lower than a cut-off frequency in the uplink modulation signal to pass, and suppress a signal whose frequency is higher than the cut-off frequency in the uplink modulation signal to pass. Specifically, the first low pass filter 520 may be composed of a device such as a capacitor and an inductor. For example, as shown in FIG. 8, the first low pass filter 520 may be composed of three inductors and one capacitor. Finally, the uplink modulation signal is coupled to the first touch point 803 via the second capacitor 530 and transmitted to the first device via the first touch point 803.

Further, in the embodiment of the present application, based on the case that the first circuit 600 has the first low pass filter 520, the second circuit 700 may be designed in combination with the circuit elements of the first circuit 600.

In an embodiment, the second circuit 700 may share the second capacitor 530 with the first circuit.

Figure 9:
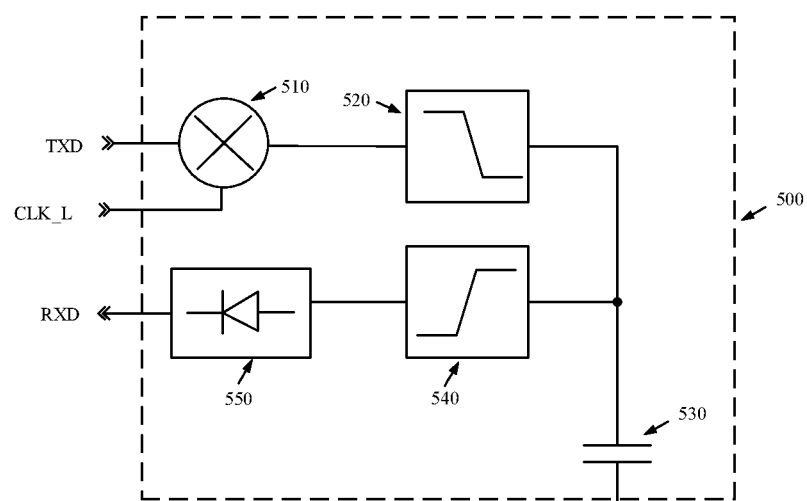
FIG. 9 is a schematic diagram of a charging detection circuit according to an embodiment of the present application.
Figure 9:
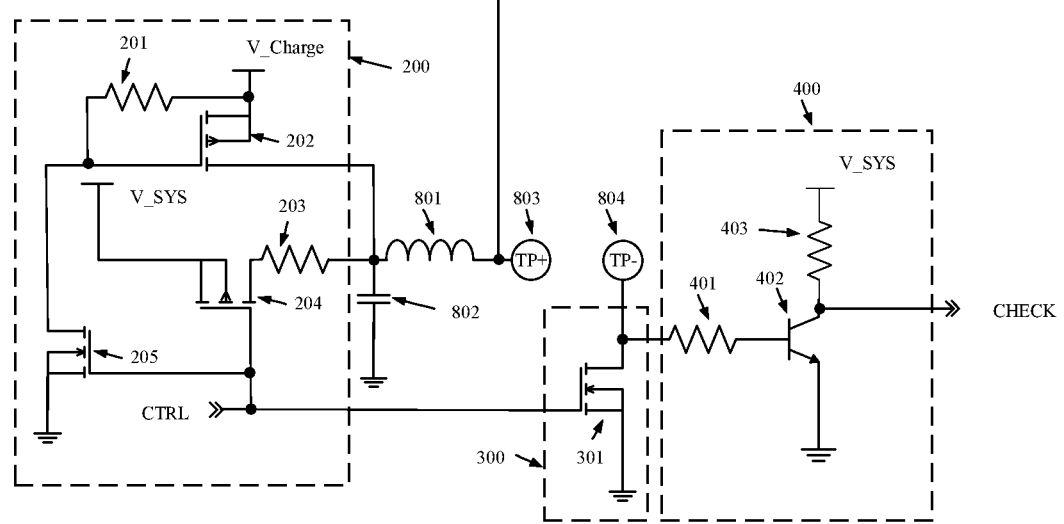

For example, as shown in FIG. 9, the second circuit 700 may include the second capacitor 530, a first high pass filter 540 and a first detector 550.

Specifically, the second capacitor 530 is connected to the first detector 550 via the first high pass filter 540. After the first circuit 600 transmits the uplink modulation signal to the first device, the first detector 550 detects the downlink modulation signal transmitted by the first device through the second capacitor 530 and the first high pass filter 540 sequentially.

Figure 10:
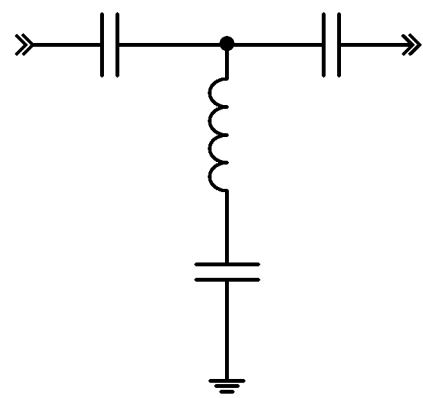
FIG. 10 is a schematic structural diagram of a high pass filter according to an embodiment of the present application.

It should be understood that the first high pass filter (High Pass Filter, HPF) 540 involved in the embodiment of the present application may allow a signal whose frequency is higher than a cut-off frequency in the downlink modulation signal to pass, and suppress a signal component whose frequency is below the cut-off frequency. In other words, the first high pass filter 540 in the embodiment of the present application removes an unnecessary low frequency component in the downlink modulation signal or removes low frequency interference. Specifically, the first high pass filter 540 may be composed of a device such as a capacitor, an inductor and a resistor. For example, as shown in FIG. 10, the first high pass filter 540 may be composed of three capacitors and one inductor.

It can be seen that in the circuit structure shown in FIG. 9, the first low pass filter 520 and the first high pass filter 540 may form a full-time duplexer in the first communication circuit 500, which could separate the uplink modulation signal from the downlink modulation signal, and further suppress interference between the signals.

Specifically, the first circuit 600 filters the uplink modulation signal with the first low pass filter 520, and the second circuit 700 filters the downlink modulation signal with the first high pass filter 540. Assume that in the embodiment of the present application, the frequency of the uplink modulation signal is f_1 and the frequency of the downlink modulation signal is 2f_1, the first low pass filter 520 can attenuate the signal with the frequency of 2f_1 and above in the uplink modulation signal, and reduce an interference of the downlink modulation signal to the system. Similarly, the first high pass filter 540 can attenuate the signal with the frequency of f_1 and below in the downlink modulation signal, such that the first detector 550 cannot detect the uplink modulation signal, thereby reducing an interference of the uplink modulation signal to the system.

It should be understood that, in the embodiment of the present application, interchange of the first low pass filter 520 in the first circuit 600 and the first high pass filter 540 in the second circuit 700 is also regarded as a variation of the first communication circuit 500 in the embodiment of the present application, which is also within the protection scope of the present application.

In addition, the function of the first detector 550 is to integrate the downlink modulation signal, filter out the carrier signal used for modulation, and detect the downlink signal which may be receive data (Receive Data, RXD) on a receive data port of the system.

In another embodiment, the second circuit 700 may share the second capacitor 530 and the first low pass filter 520 with the first circuit.

Figure 11:
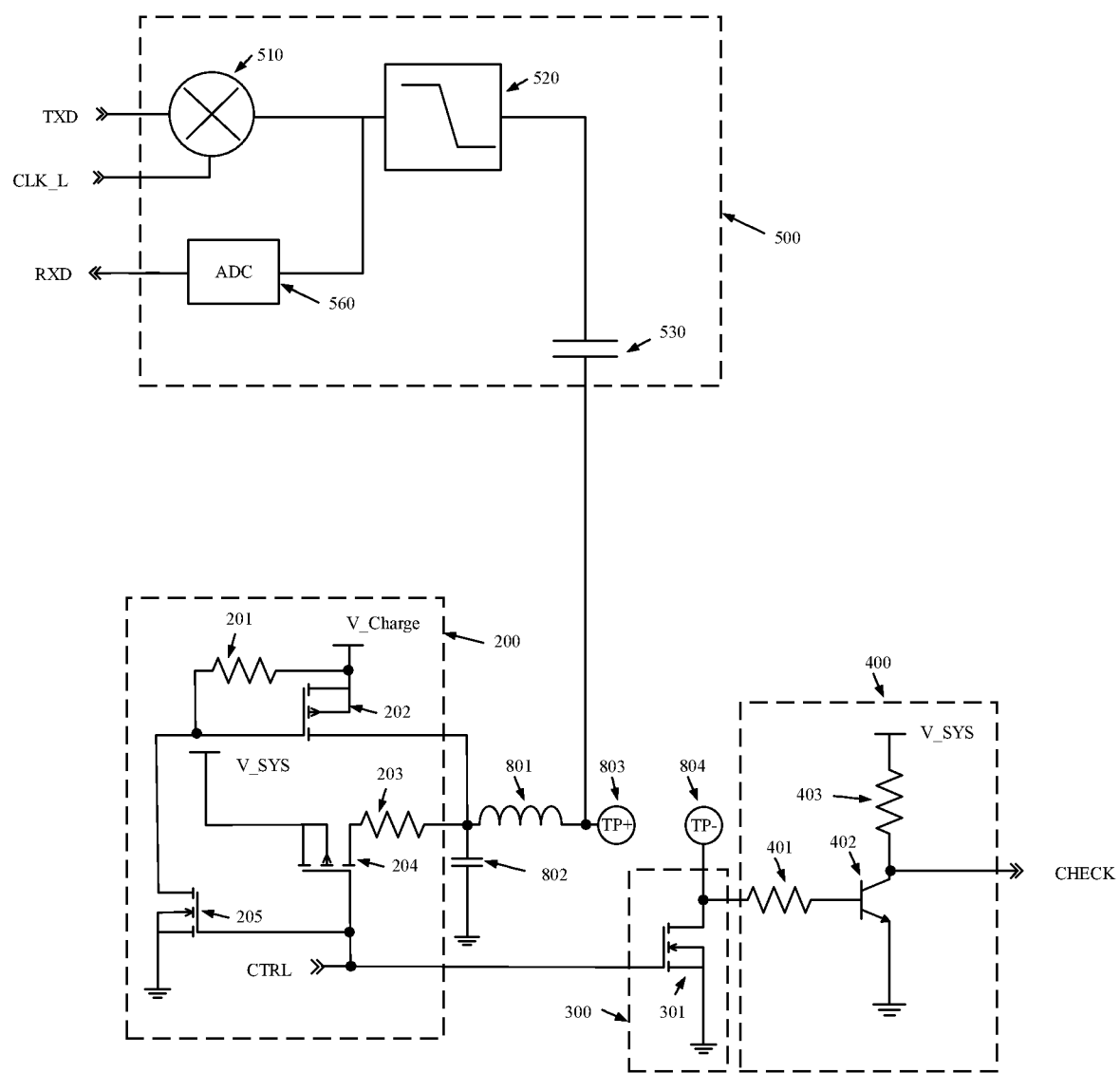
FIG. 11 is another schematic diagram of a charging detection circuit according to an embodiment of the present application.

For example, as shown in FIG. 11, the second circuit 700 may include the second capacitor 530, the first low pass filter 520 and an analog to digital converter 560.

Specifically, the second capacitor 530 is connected to the analog to digital converter 560 via the first low pass filter 520. After the first circuit 600 transmits the uplink modulation signal to the first device, the analog to digital converter 560 is configured to capture the downlink modulation signal transmitted by the first device through the second capacitor 530 and the first low pass filter 520 sequentially.

It can be understood that, as shown in the implementation manner of the second circuit 700 in FIG. 11, the first low pass filter 520 may suppress interference between signals in a time division duplex communication manner. Hereby, the uplink modulation signal and the downlink modulation signal are in the same frequency, and this not only saves the first high pass filter, but also transmits the downlink modulation signal directly to the analog to digital converter 560 (Analog to Digital Converter, ADC) of a main control chip without detection, and then the analog to digital converter 560 directly samples the downlink modulation signal. Compared with the circuit structure of the second circuit 700 shown in FIG. 9, such an implementation manner could simplify a circuit and reduce costs, but improves operational complexity of software.

Further, in order to improve the accuracy of sampling, in the embodiment of the present application, the analog to digital converter 560 may have a sampling rate greater than twice of the RXD communication baud rate. It should be understood, however, that the above-described number twice is merely an exemplary description and is not intended to limit the embodiment of the present application. For example, it may be 5 times, 4.5 times, 3 times, and the like.

It should be noted that, in the embodiment of the present application, the second circuit 700 may be designed in combination with the circuit elements of the first circuit 600. The second circuit may also be designed without regard to the circuit elements of the first circuit 600. This is not limited by the embodiment of the present application. For example, the second circuit 700 may also be designed in combination with a circuit element other than the first circuit 600 in the charging detection circuit. For another example, the second circuit 700 may also be designed as a separate circuit.

In an embodiment, the second circuit 700 may also be designed in combination with the circuit elements of the charging circuit 300. Specifically, since there is also a MOS transistor in the charging circuit 300 in the embodiment of the present application, the second circuit 700 may share the MOS transistor with the charging circuit 300 when the second circuit 700 is designed to include a MOS transistor.

Figure 12:
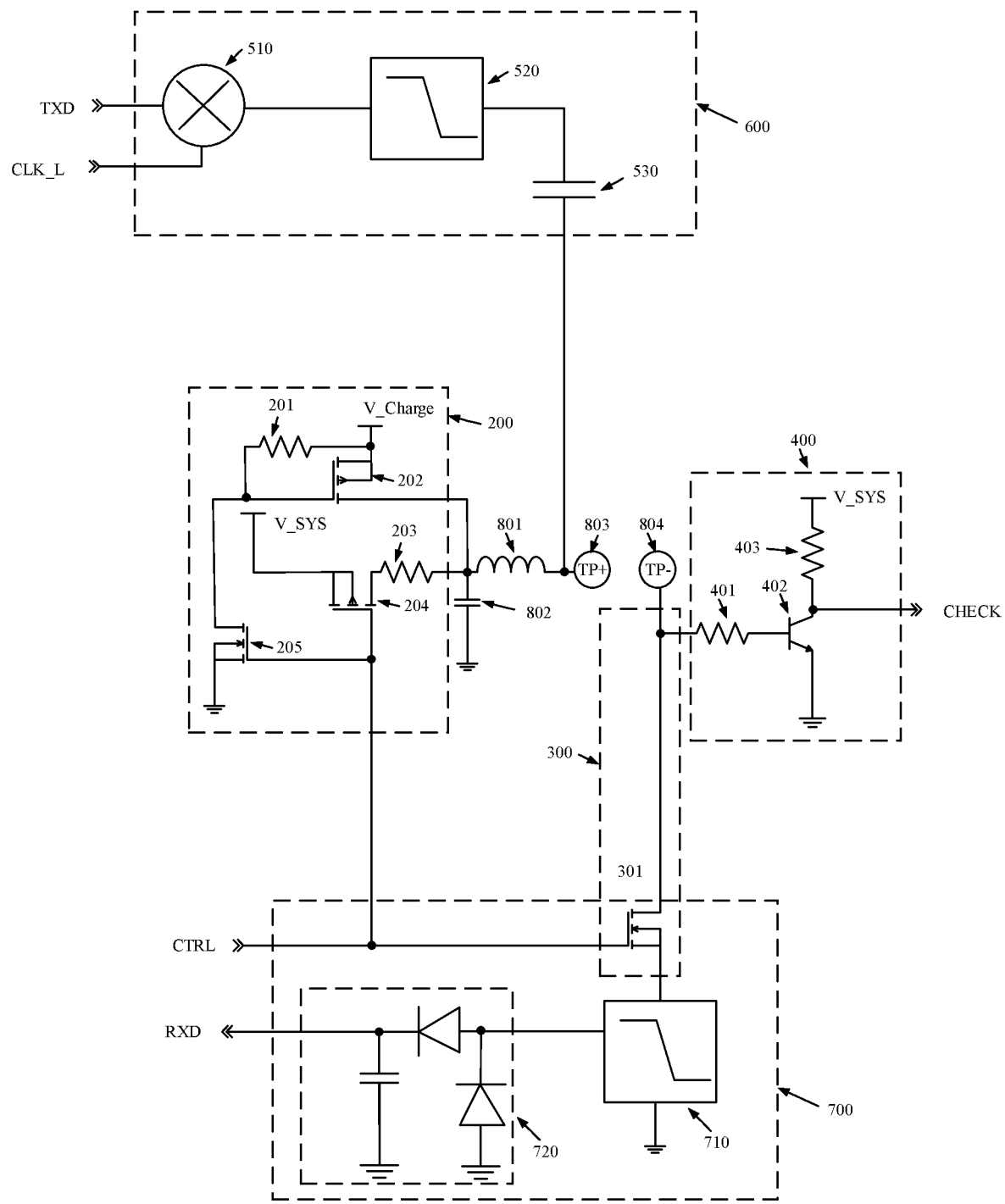
FIG. 12 is yet another schematic diagram of a charging detection circuit according to an embodiment of the present application.

For example, as shown in FIG. 12, the second circuit 700 may also include a first metal oxide semiconductor MOS transistor, a second low pass filter 710 and a second detector 720.

Specifically, the first MOS transistor is connected to the second detector 720 via the second low pass filter 710. In other words, the fifth MOS transistor 301 and the first MOS transistor in the charging circuit may be the same MOS transistor. That is, the second circuit 700 and the charging circuit 300 share the fifth MOS transistor 301.

More specifically, after the first circuit 600 transmits the uplink modulation signal to the first device, the control signal controls the first MOS transistor to be turned on, and the second detector 720 detects the downlink modulation signal transmitted by the first device through the first MOS transistor and the second low pass filter 710 sequentially.

Compared to the circuit structure of the second circuit 700 shown in FIG. 9, the implementation manner of the embodiment of the present application is realized by connecting the second circuit 700 to the source of the fifth MOS transistor 301, and replacing the first high pass filter with the same low pass filter as that on the uplink. Accordingly, a bill of material (Bill of Material, BOM) of an electronic element could be simplified, but there is a drawback that a low pass filter generally uses a large amount of inductance, which is slightly more expensive than a capacitor, and the fifth MOS transistor 301 is required to be a high-frequency transistor.

It should be understood that the second circuit 700 may be designed as a separate circuit. That is, the fifth MOS transistor 301 and the first MOS transistor in the charging circuit may also be not the same MOS transistor.

It should also be understood that the above embodiments are merely exemplary embodiments of the present application, and the above drawings are merely exemplary drawings of the circuit structures of the embodiments of the present application. That is, the above embodiments and the above description of the drawings should not limit the embodiments of the present application.

In addition, the charging detection circuit mentioned in the embodiments of the present application may be applied to any type of charging device. That is, the embodiments of the present application provide a charging device including the above charging detection circuit, for example, a charging case, a mobile power source, and the like.

In addition, the charging detection circuit mentioned in the embodiments of the present application may also be applied to the first device in the embodiments of the present application, and the first device is any electronic device that needs to be charged. For example, the electronic device may be an intelligent wearable device such as an earphone or a wristband; and for another example, the electronic device may be a mobile phone, a tablet, a laptop, a computer, MP3 and MP4, etc. That is, the embodiments of the present application further provide a first device. Specifically, the first device may be used in conjunction with the above charging device.

Figure 13:
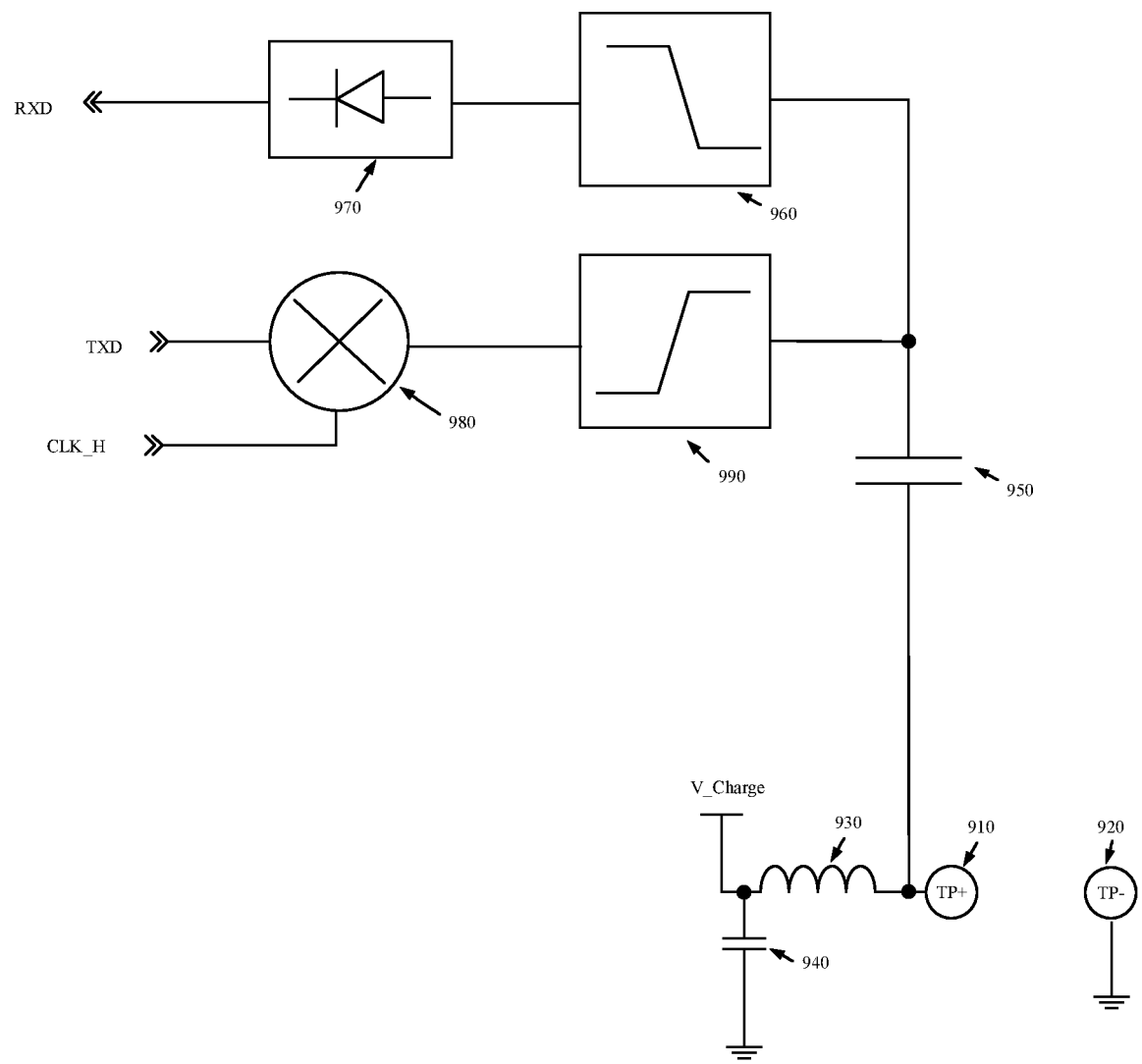
FIG. 13 is a schematic circuit diagram of a first device according to an embodiment of the present application.

FIG. 13 is a schematic circuit diagram of a first device according to an embodiment of the present application.

Since a charging device is used in conjunction with a first device in an embodiment of the present application, bi-directional communication or time-division bi-directional communication could be realized. Specifically, a spectrum is distinguished through a high pass filter and a low pass filter in a full-time duplex circuit. Taking the first device being an earphone as an example, an embodiment of the present disclosure further provides a communication apparatus of an earphone, including: a third touch point, a fourth touch point and a second communication circuit, where the second communication circuit is connected to the third touch point and/or the fourth touch point; and when the third touch point and the fourth touch point are both in contact with a charging detection circuit, and the second communication circuit receives an uplink modulation signal transmitted by the charging detection circuit via the third touch point or the fourth touch point, the second communication circuit transmits a downlink modulation signal to the charging detection circuit via the third touch point or the fourth touch point, where an uplink signal generated after demodulating the uplink modulation signal is used to request the earphone to transmit the downlink modulation signal to the charging detection circuit, and the downlink modulation signal includes information about a state of charge of the earphone.

For example, as shown in FIG. 13, the communication apparatus of the earphone may include a third touch point 910, a fourth touch point 920, a second inductor 930, a third capacitor 950, a fourth capacitor 940, a third low pass filter 960, a third detector 970, a second mixer 980 and a second high pass filter 990. Specifically, the second mixer 980 may modulate an uplink signal of a system to the frequency of a carrier signal (CLK_H) for transmission, and the third detector 970 detects the received downlink signal. Since the circuit structure (a second communication circuit) and the operating principle are similar to those of the first communication circuit in the charging detection circuit of the embodiments of the present application, details are not described herein again in order to avoid repetition. It should be understood that although the above embodiments are exemplified by a first device used in conjunction with a charging device, an application scenario should not be limited in actual product applications. For example, in other alternative embodiments, the circuit shown in FIG. 13 may also be separately manufactured as a communication apparatus for installation in a terminal device that requires information interaction with a charging device, such as a communication apparatus for installation in an earphone. Finally, in combination with the charging device described above, an embodiment of the present application further provides a charging system. Specifically, the charging system may include the charging device described above and the first device used in conjunction with the charging device, or may also include the charging detection circuit described above and the communication apparatus including the second communication circuit described above.

Finally, it should be noted that terms used in embodiments of the present disclosure and the claims appended hereto are merely for the purpose of describing particular embodiments, and are not intended to limit the embodiments of the present disclosure.

For example, the use of a singular form of "a", "said" and "the" in the embodiment of the present disclosure and the claims appended hereto are also intended to include a plural form, unless otherwise clearly indicated herein by context.

Those of ordinary skill in the art may be aware that, components of various examples described in the embodiments disclosed in this paper may be implemented by electronic hardware or a combination of computer software and the electronic hardware. To clearly illustrate interchangeability of hardware and software, compositions and steps of the various examples have been described generally in terms of functionality in the above description. Whether these functions are executed in hardware or software mode depends on a particular application and a design constraint condition of the technical solutions. Persons skilled in the art may use different methods to implement the described functions for every particular application, but it should not be considered that such implementation goes beyond the scope of the present application.

It will be apparent to those skilled in the art that the above described apparatuses and components may or may not be physically separated for convenience and brevity of the description. Part of or all of the units here may be selected according to a practical need to achieve the objects of the embodiments of the present disclosure. In addition, the displayed or discussed mutual coupling or direct coupling or communication connection may be indirect coupling or communication connection through some interfaces, apparatuses or units, and may also be electrical, mechanical, or connection in other forms.

The above content is merely specific implementation manners of the embodiments of the present disclosure, however, the protection scope of the present disclosure is not limited thereto. Various modifications or replacements may be readily conceivable to any person skilled in the art within the technical scope disclosed in the present disclosure, and shall fall within the protection scope of the present disclosure. Therefore, the protection scope of the embodiments of the present disclosure shall be subject to the protection scope of the claims.

What is claimed is:

1. A charging detection circuit comprising:
a first touch point;
a second touch point;
a switching circuit;
a charging circuit;
a detecting circuit; and a first communication circuit,
wherein the switching circuit is connected to the first touch point, and the switching circuit is configured to switch a supply voltage of the first touch point between a system voltage and a charging voltage according to a control signal;
the charging circuit is connected to the detecting circuit via the second touch point;
the first communication circuit is connected to the first touch point and/or the second touch point; and
when the supply voltage of the first touch point is the system voltage, and the first touch point and the second touch point are both in contact with a first device, the detecting circuit triggers the first communication circuit to acquire a state of charge of the first device via the first touch point and/or the second touch point;
wherein the first communication circuit comprises:
a first circuit and a second circuit,
wherein when the detecting circuit triggers the first communication circuit to acquire the state of charge of the first device, the first circuit generates an uplink modulation signal according to an uplink signal and a carrier signal received, and transmits the uplink modulation signal to the first device via the first touch point or the second touch point, and then the second circuit receives a downlink modulation signal transmitted by the first device via the first touch point or the second touch point; and
wherein the uplink signal is used to request the first device to transmit the downlink modulation signal to the second circuit, and the downlink modulation signal includes information about the state of charge of the first device;
and the first circuit comprises:
a first mixer, a first low pass filter and a second capacitor,
wherein the first mixer is connected to the second capacitor via the first low pass filter; and
when the detecting circuit triggers the first communication circuit to acquire the state of charge of the first device, the first mixer receives the uplink signal and the carrier signal, and generates the uplink modulation signal according to the uplink signal and the carrier signal, and the uplink modulation signal is transmitted to the first device via the first low pass filter and the second capacitor sequentially.

2. The charging detection circuit according to claim 1, wherein:
when the state of charge is in an under-voltage state, the control signal controls the switching circuit to connect the first touch point to the charging voltage such that the charging circuit charges the first device; or
when the state of charge is in a full-charge state, the control signal controls the switching circuit to connect the first touch point to the system voltage, and controls the charging circuit to be an open circuit.

3. The charging detection circuit according to claim 1, wherein the charging detection circuit further comprises:
a first inductor and a first capacitor,
wherein one end of the first inductor is connected to the switching circuit and connected to the ground via the first capacitor, and the other end of the first inductor is connected to the first touch point.

4. The charging detection circuit according to claim 1, wherein:
the first circuit is connected to the first touch point, and the second circuit is connected to the first touch point or the second touch point;

when the detecting circuit triggers the first communication circuit to acquire the state of charge of the first device, the first circuit transmits the uplink modulation signal via the first touch point, and
the second circuit receives the downlink modulation signal via the first touch point when the second circuit is connected to the first touch point, or
the second circuit receives the downlink modulation signal via the second touch point when the second circuit is connected to the second touch point.

5. The charging detection circuit according to claim 1, wherein the second circuit is one of the following circuits:
the second capacitor, a first high pass filter and a first detector,
wherein the second capacitor is connected to the first detector via the first high pass filter, and
after the first circuit transmits the uplink modulation signal to the first device, the first detector detects the downlink modulation signal transmitted by the first device through the second capacitor and the first high pass filter sequentially; or
the second capacitor, the first low pass filter and an analog to digital converter,
wherein the second capacitor is connected to the analog to digital converter via the first low pass filter, and
after the first circuit transmits the uplink modulation signal to the first device, the analog to digital converter is configured to capture the downlink modulation signal transmitted by the first device through the second capacitor and the first low pass filter sequentially; or
a first metal oxide semiconductor MOS transistor, a second low pass filter and a second detector,
wherein the first MOS transistor is connected to the second detector via the second low pass filter, and
after the first circuit transmits the uplink modulation signal to the first device, the control signal controls the first MOS transistor to be turned on, and the second detector detects the downlink modulation signal transmitted by the first device through the first MOS transistor and the second low pass filter sequentially.

6. The charging detection circuit according to claim 5, wherein the charging detection circuit comprises:
a fifth MOS transistor, wherein the second touch point is connected to the ground via the fifth MOS transistor, and a gate of the fifth MOS transistor receives the control signal.

7. The charging detection circuit according to claim 6, wherein the first MOS transistor and the fifth MOS transistor are the same MOS transistor.

8. The charging detection circuit according to claim 1, wherein the switching circuit comprises:
a second MOS transistor, a third MOS transistor and a fourth MOS transistor,
wherein the second MOS transistor receives the charging voltage and is connected to the first touch point, and the second MOS transistor is connected to the ground via the fourth MOS transistor;
the third MOS transistor receives the system voltage and is connected to the first touch point; and
the control signal controls the third MOS transistor to be turned on or off, and controls the second MOS transistor to be turned off or on by controlling the fourth MOS transistor so as to make the supply voltage of the first touch point switch between the system voltage and the charging voltage.

9. The charging detection circuit according to claim 8, wherein the switching circuit further comprises:

a first resistor and a second resistor,
wherein a source of the second MOS transistor receives the charging voltage, the source of the second MOS transistor is connected to a gate of the second MOS transistor via the first resistor, the gate of the second MOS transistor is connected to the ground via the fourth MOS transistor, a drain of the second MOS transistor is connected to the first touch point, and a gate of the fourth MOS transistor receives the control signal; and
a source of the third MOS transistor receives the system voltage, a drain of the third MOS transistor is connected to the first touch point via the second resistor, and a gate of the third MOS transistor receives the control signal.

10. The charging detection circuit according to claim 1, wherein the detecting circuit comprises:
a third resistor, a triode transistor and a fourth resistor,
wherein the second touch point is connected to a gate of the triode transistor via the third resistor;
one end of the fourth resistor receives the system voltage, and the other end of the fourth resistor is connected to the ground via the triode transistor; and
when the supply voltage of the first touch point is the system voltage, and the first touch point and the second touch point are both in contact with the first device, the triode transistor is turned on and triggers the first communication circuit to acquire the state of charge of the first device via the first touch point and/or the second touch point.

11. The charging detection circuit according to claim 1, wherein the first device is a wireless earphone.

12. A charging case, comprising:
the charging detection circuit according to claim 1.

13. A communication apparatus of charging, comprising:
a third touch point;
a fourth touch point; and
a second communication circuit,
wherein the second communication circuit is connected to the third touch point and/or the fourth touch point; and
when the third touch point and the fourth touch point are both in contact with a charging detection circuit, and the second communication circuit receives an uplink modulation signal transmitted by the charging detection circuit via the third touch point or the fourth touch point, the second communication circuit transmits a downlink modulation signal to the charging detection circuit via the third touch point or the fourth touch point,
wherein an uplink signal generated after demodulating the uplink modulation signal is used to request a first device to transmit the downlink modulation signal to the charging detection circuit, and the downlink modulation signal includes information about a state of charge of the first device, wherein the charging detection circuit is the charging detection circuit of claim 1.

14. The communication apparatus according to claim 13, wherein the second communication circuit comprises:
a third circuit and a fourth circuit,
wherein the third circuit and the fourth circuit are both connected to the third touch point; and
when the third circuit receives the uplink modulation signal transmitted by the charging detection circuit, the fourth circuit transmits the downlink modulation signal to the charging detection circuit.

15. The communication apparatus according to claim 14, wherein the third circuit comprises:

a third capacitor, a third low pass filter and a third detector,
wherein the third capacitor is connected to the third detector via the third low pass filter; and
the third detector detects the uplink modulation signal transmitted by the charging detection circuit through the third capacitor and the third high pass filter sequentially.

16. The communication apparatus according to claim 14, wherein the fourth circuit comprises:
a second mixer;
a second high pass filter; and
the third capacitor,
wherein the second mixer is connected to the third capacitor via the second high pass filter; and
the second mixer receives a downlink signal and a carrier signal, and generates the downlink modulation signal according to the downlink signal and the carrier signal, and the downlink modulation signal is transmitted to the charging detection circuit through the second high pass filter and the third capacitor sequentially.

17. The communication apparatus according to claim 13, wherein the second communication circuit comprises:
a second inductor; and
a fourth capacitor,
wherein the third touch point is connected to one end of the fourth capacitor via the second inductor, and the one end of the fourth capacitor is further configured to receive a charging voltage, and the other end of the fourth capacitor is connected to the ground.

18. The communication apparatus according to claim 13, wherein the first device is a wireless earphone.

19. A charging detection circuit comprising:
a first touch point;
a second touch point;
a switching circuit;
a charging circuit;
a detecting circuit; and
a first communication circuit,
wherein the switching circuit is connected to the first touch point, and the switching circuit is configured to switch a supply voltage of the first touch point between a system voltage and a charging voltage according to a control signal;
the charging circuit is connected to the detecting circuit via the second touch point;
the first communication circuit is connected to the first touch point and/or the second touch point; and
when the supply voltage of the first touch point is the system voltage, and the first touch point and the second touch point are both in contact with a first device, the detecting circuit triggers the first communication circuit to acquire a state of charge of the first device via the first touch point and/or the second touch point;
wherein the detecting circuit comprises:
a third resistor, a triode transistor and a fourth resistor,
wherein the second touch point is connected to a gate of the triode transistor via the third resistor;
one end of the fourth resistor receives the system voltage, and the other end of the fourth resistor is connected to the ground via the triode transistor; and
when the supply voltage of the first touch point is the system voltage, and the first touch point and the second touch point are both in contact with the first device, the triode transistor is turned on and triggers the first communication circuit to acquire the state of charge of the first device via the first touch point and/or the second touch point.

20. A communication apparatus of charging, comprising:
a third touch point;
a fourth touch point; and
a second communication circuit,
wherein the second communication circuit is connected to the third touch point and/or the fourth touch point; and
when the third touch point and the fourth touch point are both in contact with a charging detection circuit, and the second communication circuit receives an uplink modulation signal transmitted by the charging detection circuit via the third touch point or the fourth touch point, the second communication circuit transmits a downlink modulation signal to the charging detection circuit via the third touch point or the fourth touch point,
wherein an uplink signal generated after demodulating the uplink modulation signal is used to request a first device to transmit the downlink modulation signal to the charging detection circuit, and the downlink modulation signal includes information about a state of charge of the first device;
wherein the second communication circuit comprises:
a third circuit and a fourth circuit,
wherein the third circuit and the fourth circuit are both connected to the third touch point; and
when the third circuit receives the uplink modulation signal transmitted by the charging detection circuit, the fourth circuit transmits the downlink modulation signal to the charging detection circuit;
wherein the third circuit comprises:
a third capacitor, a third low pass filter and a third detector,
wherein the third capacitor is connected to the third detector via the third low pass filter; and
the third detector detects the uplink modulation signal transmitted by the charging detection circuit through the third capacitor and the third high pass filter sequentially; and
wherein the charging detection circuit comprises:
a first touch point;
a second touch point;
a switching circuit;
a charging circuit;
a detecting circuit; and
a first communication circuit,
wherein the switching circuit is connected to the first touch point, and the switching circuit is configured to switch a supply voltage of the first touch point between a system voltage and a charging voltage according to a control signal;
the charging circuit is connected to the detecting circuit via the second touch point;
the first communication circuit is connected to the first touch point and/or the second touch point; and
when the supply voltage of the first touch point is the system voltage, and the first touch point and the second touch point are both in contact with the first device, the detecting circuit triggers the first communication circuit to acquire a state of charge of the first device via the first touch point and/or the second touch point.

* * * * *